(12) United States Patent
Favata et al.

(10) Patent No.: US 11,557,456 B2
(45) Date of Patent: Jan. 17, 2023

(54) REAL-TIME DIRECT MEASUREMENT OF MECHANICAL PROPERTIES IN-SITU OF SCANNING BEAM MICROSCOPE

(71) Applicant: University of Connecticut, Farmington, CT (US)

(72) Inventors: Joseph Favata, Farmington, CT (US); Slna Shahbazmohamadi, Farmington, CT (US); Valery Ray, Farmington, CT (US); Ali Hadjikhani, Farmington, CT (US)

(73) Assignee: University of Connecticut, Farmington, CT (US)

( * ) Notice: Subject to any disclaimer, the term of this patent is extended or adjusted under 35 U.S.C. 154(b) by 743 days.

(21) Appl. No.: 16/569,384

(22) Filed: Sep. 12, 2019

(65) Prior Publication Data

US 2020/0090901 A1 Mar. 19, 2020

Related U.S. Application Data

(60) Provisional application No. 62/731,360, filed on Sep. 14, 2018.

(51) Int. Cl.
*G01N 3/08* (2006.01)
*H01J 37/256* (2006.01)
*H01J 37/244* (2006.01)
*G01N 3/06* (2006.01)

(52) U.S. Cl.
CPC ............ *H01J 37/256* (2013.01); *G01N 3/068* (2013.01); *G01N 3/08* (2013.01); *H01J 37/244* (2013.01)

(58) Field of Classification Search
None
See application file for complete search history.

(56) References Cited

U.S. PATENT DOCUMENTS

| | | | |
|---|---|---|---|
| 6,289,734 B1 | 9/2001 | Daugela | |
| 6,590,212 B1 | 7/2003 | Joseph et al. | |
| 7,107,694 B2 | 9/2006 | Yang et al. | |
| 7,287,418 B2 * | 10/2007 | Yang | G01N 3/08 73/81 |
| 7,287,419 B2 | 10/2007 | Yang et al. | |
| 7,287,420 B2 * | 10/2007 | Yang | G01N 3/08 73/81 |
| 7,798,011 B2 | 9/2010 | Warren et al. | |
| 8,161,803 B2 * | 4/2012 | Oh | G01N 3/40 977/956 |
| 8,434,370 B2 * | 5/2013 | Oh | G01L 1/005 73/774 |
| 8,453,498 B2 | 6/2013 | Warren et al. | |
| 8,738,315 B2 * | 5/2014 | Oh | G01Q 10/065 702/113 |

(Continued)

OTHER PUBLICATIONS

Hysitron, "PI 87 SEM PicoIndenter," retrieved from <http://www.novaanalitik.com/pdf/pi87.pdf> publicly available prior to Jul. 8, 2018.

*Primary Examiner* — Lisa M Caputo
*Assistant Examiner* — Nigel H Plumb
(74) *Attorney, Agent, or Firm* — Michael Best & Friedrich LLP

(57) ABSTRACT

System and methods are described for directly measuring mechanical properties of a sample while concurrently imaging the sample using a scanning beam microscope (e.g., a scanning electron microscope (SEM)).

20 Claims, 13 Drawing Sheets

(56) References Cited

U.S. PATENT DOCUMENTS

| | | | |
|---|---|---|---|
| 8,789,425 B2 | 7/2014 | Oh et al. | |
| 9,157,845 B2 * | 10/2015 | Oh | G01Q 60/366 |
| 9,304,072 B2 | 4/2016 | Oh et al. | |
| 9,335,240 B2 * | 5/2016 | Oh | B82Y 35/00 |
| 9,404,841 B2 | 8/2016 | Oh et al. | |
| 9,472,374 B2 * | 10/2016 | Cyrankowski | G21K 5/10 |
| 9,488,470 B1 * | 11/2016 | Peterson | G01B 9/0209 |
| 2007/0089498 A1 * | 4/2007 | Su | G01Q 10/045 73/105 |
| 2017/0169989 A1 | 6/2017 | Leyte Guerrero et al. | |

* cited by examiner

REAL-TIME DIRECT MEASUREMENT OF MECHANICAL PROPERTIES IN-SITU OF SCANNING BEAM MICROSCOPE

RELATED APPLICATIONS

This application claims the benefit of U.S. Provisional Patent Application No. 62/731,360, filed Sep. 14, 2018, entitled "REAL-TIME DIRECT MEASUREMENT OF MECHANICAL PROPERTIES IN-SITU OF SCANNING BEAM MICROSCOPE," the entire contents of which are incorporated herein by reference.

BACKGROUND

The present invention relates to methods and systems for evaluating mechanical properties of an item such as, for example, microelectronic components.

SUMMARY

Current approaches to performing quality assurance (QA) mechanical tests for packaged microelectronic components utilize expensive, desktop commercial systems that probe a sample and, in some cases, allow the investigator to examine the area with an optical imaging system. Some existing testing systems are purpose-built, are very expensive, and either rely on indirect force measurement (displacement measurement-based) or measure force at a probe tip, which introduces great fragility and limits the range of applications for the force measurement apparatus.

In some implementations, the systems and methods described below provide unique vision when testing nano-scale systems. In some implementations, the system provides crystallographic or elemental compositional information. This information can be extremely useful when attempting to diagnose unexpected failure mechanisms that occur on a crystal-grain level or counterfeit techniques that manifest themselves beneath the surface of bond wires. Considering the market trends of exponential miniaturization of microelectronic components, increased microelectronic package complexity, specialty coatings, and advanced coating performance, the need for high-resolution and multi-modal imaging becomes more beneficial.

In some implementations, the systems and methods described herein can be adaptable and deployable for integration to different existing SEM, SEM/GFIB, HIM/NIM systems, and other microscope imaging system (including, for example, other focused beam microscopes). The systems can also be adapted for a variety of different testing including, for example, pull, scratch, and crush testing during imaging. In some implementations, the system isconfigured to be compatible in ultra-high vacuum and highly EM-sensitive environments, yet compact and modular enough to support a wide range of testable sample sizes and a wide performance envelope of different OEM systems.

In some implementations, the invention provides systems and methods for performing a pull-test to evaluate the bond wiring of a microelectronic device package component. There exist many packaged microelectronic architectures but the overwhelming majority feature bond wiring as the pathway for die to external lead interconnection. It is estimated that bond wires comprise 90% of all die interconnects. The staggering number of semiconductor devices manufactured every year (accounting for roughly $164 billion of 2016 US GDP) highlights the importance of bond wire integrity. Existing standards related to the quality assurance of such interconnects include: MIL STD 883, particularly the Method-2000 and Procedure-5000 series, JEDEC, particularly JESD22-A104 and JESD22-A106, and portions of SAE AS6171.

One common test conducted by manufacturers and end-users is the bond wire pull-test. The specifics of the test are detailed in the widely practiced MIL STD 883. A bond wire pull-test involves the removal of molding compound for a packaged circuit, to expose the internal components by means of acid-etching, laser ablation, ion milling, or other mechanical means. Then, the sample's bond wires are pulled until failure with both the force at failure and failure mode being recorded. Ultimately, these parameters are logged and can be used as acceptance criteria or to track large-scale production issues and anomalies. After recording the failure point for multiple wires, the sample is often imaged with an optical and/or a digital-optical microscope to examine the failure point and draw conclusions. Manufacturers and failure analysis labs conduct these tests with desktop, commercial systems.

In one embodiment, the invention provides a system for performing mechanical testing of a sample while concurrently imaging the sample using a scanning beam microscope (e.g., a scanning electron microscope (SEM)). The system includes a clamping mount configured to hold the sample and a load cell positioned proximal to the clamping mount and configured to provide a direct, real-time measurement of force on the sample end. The system further includes a controllable probe configured to apply a force to the sample. In some embodiments, the sample load cell is tiltably couplable to a sample held by the clamping mount and the controllable probe is moveable between a plurality of different mounting positions relative to the load cell.

In some such embodiments, the mechanical testing performed by the system is configured to provide information on one or more mechanical property of the sample including, for example, a bond wire pull-test, adhesion/cohesion testing of coatings, and/or another type of mechanical test. In some embodiments, adhesion/cohesion testing of coatings is performed by operating the probe to create an indentation on a surface of the sample and to then subsequently drag the probe across the testing area to scratch the coating off of the substrate surface. Force measurements are recorded during the scratch process with simultaneous imaging of the testing area. This type of adhesion/cohesion testing characterizes a failure mechanism and failure load of the coating of the sample in real time.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1A:
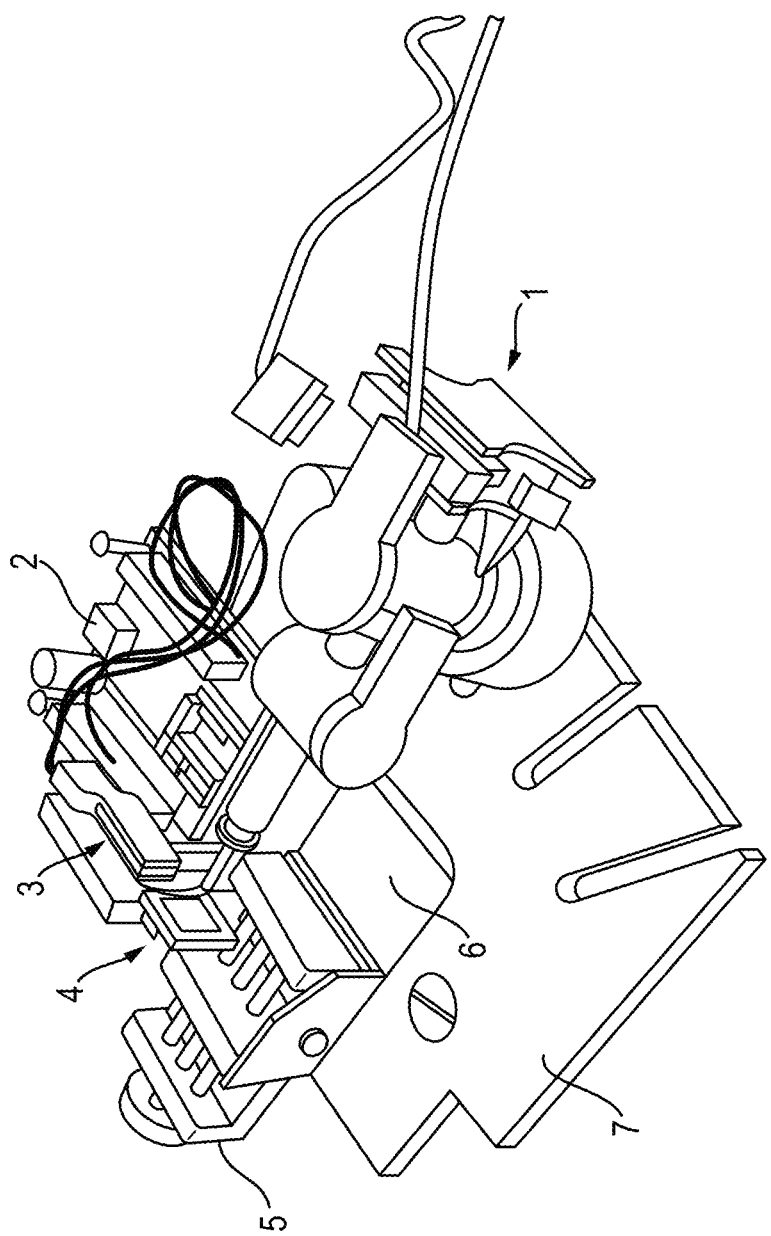
FIG. 1A is a perspective view of an apparatus for mechanical testing according to one embodiment.

FIG. 1A illustrates an example of an in-situ tester for use while capturing image data of a sample using a scanning electron microscope (SEM) system. The tester of FIG. 1A includes a micro-manipulator 1 (e.g., a Kleindiek MM3A-EM Micro-manipulator) configured to perform a pulling activity on a sample under test. The micro-manipulator 1 has three independent channels for polar movement of a hooked probe tip. The maximum pull load is rated to 1N. The micro-manipulator 1 is selectively couplable to a micro-manipulator mount 7 implemented in this example as an aluminum plate with multiple different milled slots for selectively positioning the micro-manipulator 1 relative to the sample. The length of the milled slots allow for the micro-manipulator to slide and be secured at different distances from the load cell/sample to accommodate different samples sizes, wire locations, and pull angles.

The system of FIG. 1A also includes a load cell 3 that is configured to capture force measurements after being affixed to a vertically mounted L-bracket. The vertical mounting of this example is ideal for testing outside of an electron or ion microscope or when performing scratch-based testing. A wheatstone bridge sensor 2 captures the signal from the load cell and sends it via a micro-USB port to a computer. In this example, the sensor 2 has a data capture rate of up to 125 samples per second.

Figure 1B:
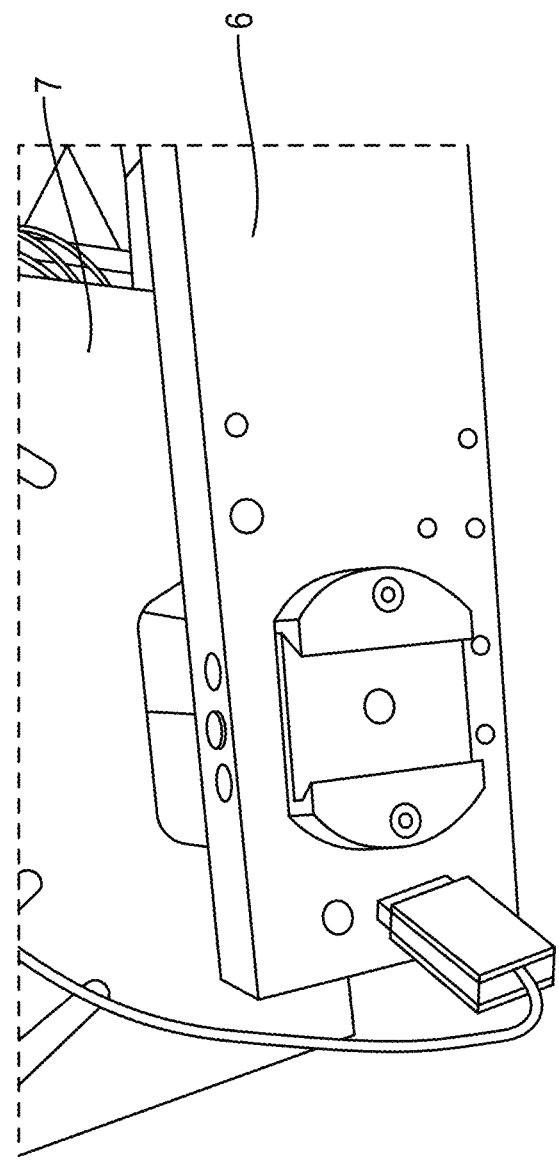
FIG. 1B is a perspective view of an underside of the apparatus of FIG. 1A.
Figure 1C:
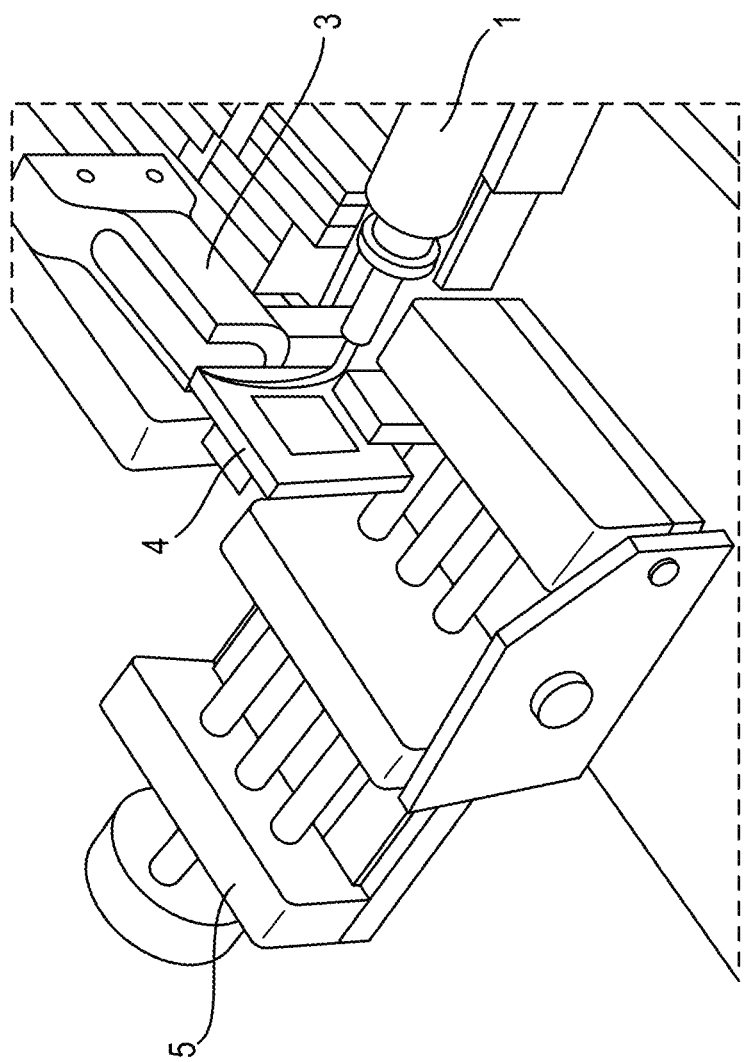
FIG. 1C is a detailed perspective view of an adjustable sample clamp of the apparatus of FIG. 1A.

In some implementations, the sample may be attached directly to the load cell 3 with an adhesive (e.g., carbon tape). However, in the example of FIG. 1A, the system also includes a tilted sample stage 5 configured to hold a sample 4 in position relative to the load cell 3 and the micro-manipulator 1. In the example of FIG. 1A, the sample is a Retail Alliance Limited QFP single die part (Part No. A-4.0000-15) with 30 μm gold (Au) bond wires. As shown in further detail in FIG. 1C, the tilted sample stage 5 in this example includes an articulated clamping mount for selectively clamping the sample 4 in place and for adjusting an angle of the sample relative to the other components of the tester system.

Figure 2:
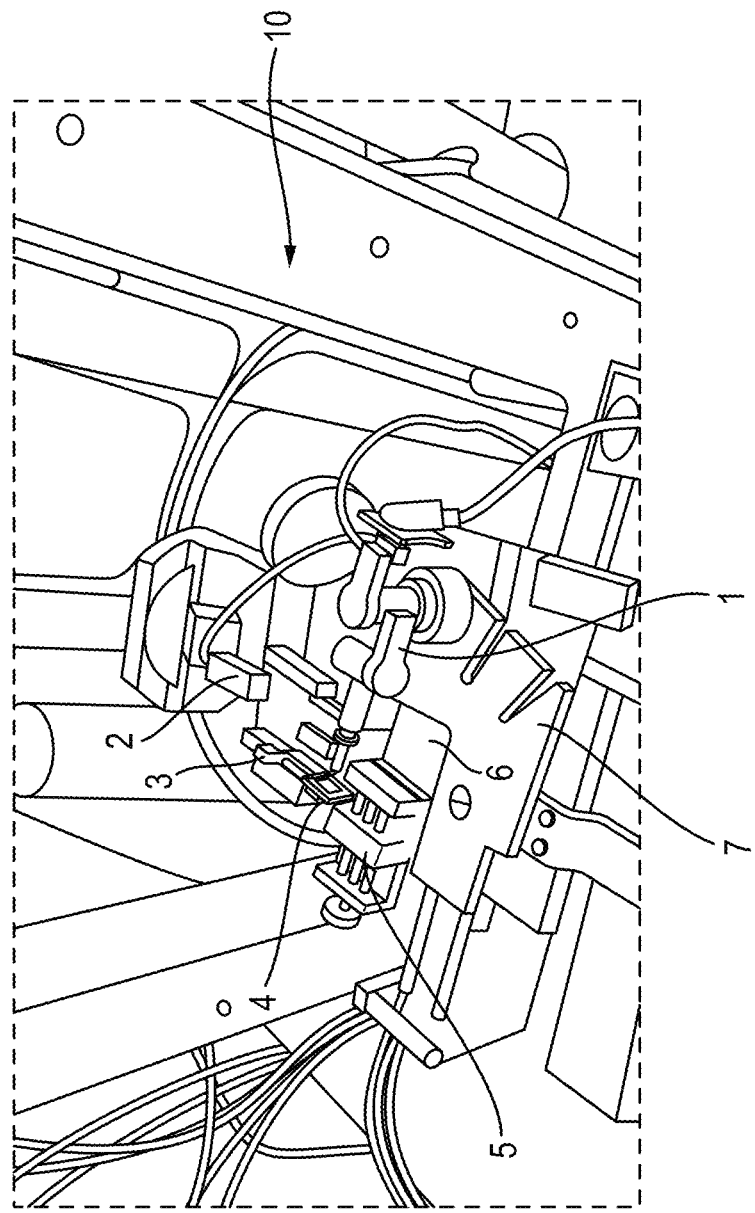
FIG. 2 is a perspective view of the apparatus of FIG. 1A positioned for use within a scanning electron microscope-focused ion beam, two-beam system.

In the example of FIG. 1A, the micro-manipulator mount 7, the tilted sample stage 5, the load cell 3, and the wheatstone bridge sensor 2 are all coupled to a base mount 6 configured to hold the components in place relative to each other during testing. The base mount 6 in this example includes an aluminum base with a dovetail joint underneath for mounting within a focused beam microscope system (e.g., an SEM system) as shown in further detail in FIG. 1B. FIG. 2 shows the tester system of FIG. 1A mounted within an SEM chamber with the door open for atmospheric testing.

Although the example of FIGS. 1A, 1B, 1C, and 2 includes a micromanipulator 1 that is configured to pull the probe in only a single direction (i.e., a single axis or dimension of operation), in other implementations, the micromanipulator 1 is just one example of a type of actuator that may be included in the system for performing some mechanical manipulation of the sample. In other implementations, the micromanipulator 1 may include a different type of actuator for adjusting the position of the probe. For example, the micromanipulator 1 may be replaced with an actuator (such as, for example, a Kleindiek Nanotechnik LT6620) configured to provide controllable movement of a probe tip in multiple dimensions (i.e., a bidirectional (x-y) stage instead of a single-directional (x) stage).

Additionally, the example described above in reference to FIGS. 1A, 1B, 1C, and 2 include adjustable sample stage 5 configured to adjust the angle of the sample relative to the other components of the system. In some implementations, this sample stage 5 can be tilt-adjusted to change the angle of the sample surface relative to a pulling direction of the micromanipulator from a first position in which the pulling direction is generally perpendicular to a surface of the sample to a second position in which the pulling direction is generally parallel to the surface of the sample and various other additional positions in between. By adjusting the angle of the surface of the sample relative to the pulling direction, the system can be adapted for various different types of mechanical testing. For example, as discussed in further detail below, a bond wire pull-test can be performed with the sample held in the first position (such that the wire is pulled directly away from the sample surface) or with the sample held in the second position (such that the wire is pulled "sideways" on the sample surface).

In another particular example, the angle of the sample relative to the pulling direction of the probe can be adapted for adhesion/cohesion testing of coatings. Adhesion and cohesion testing of coatings are common practices in the characterization of coating systems that provide optical, thermal, electrical, electrochemical, and other types of properties to an overall system. However, the system illustrated above can be adapted to provide adhesion and cohesion testing of coatings by operating the probe to create an indentation in a surface of the sample and then subsequently dragging the probe across a testing area to scratch the coating off the surface/substrate. Force measurements are recorded during the scratch process with simultaneous imaging of the testing area to characterize a failure mechanism and failure load.

Although the example described above includes a sample stage with an adjustable tilted clamp, in other implementations, the system may include a fixed-angle clamp that is configured to hold a sample only at a single angle relative to the pulling direction (e.g., selected for one or more specific testing procedures). Also, in various different implementations that do include a tiltably adjustable sample stage, the clamp may be discretely adjustable (i.e., positionable at a defined number of different positions) or continuously adjustable (i.e., positionable at any number of different positions). Similarly, although the examples described herein include only one load cell, in some implementations, the system may be adapted to include multiple different load cells (e.g., three load cells to measure force in each of three different spatial axes). For example, in some implementations, the system may be configured with different types and quantities of load cells (e.g., three load cells capable of sensing force in one spatial axis or a load cell capable of sensing force in three dimensions). Depending on the particular configuration, the output signal or signals—whether analog or digital—from these load cells can be processed in an algorithm (e.g., square root from the sum of squares) to calculated the resultant force on the sample.

Figure 3:
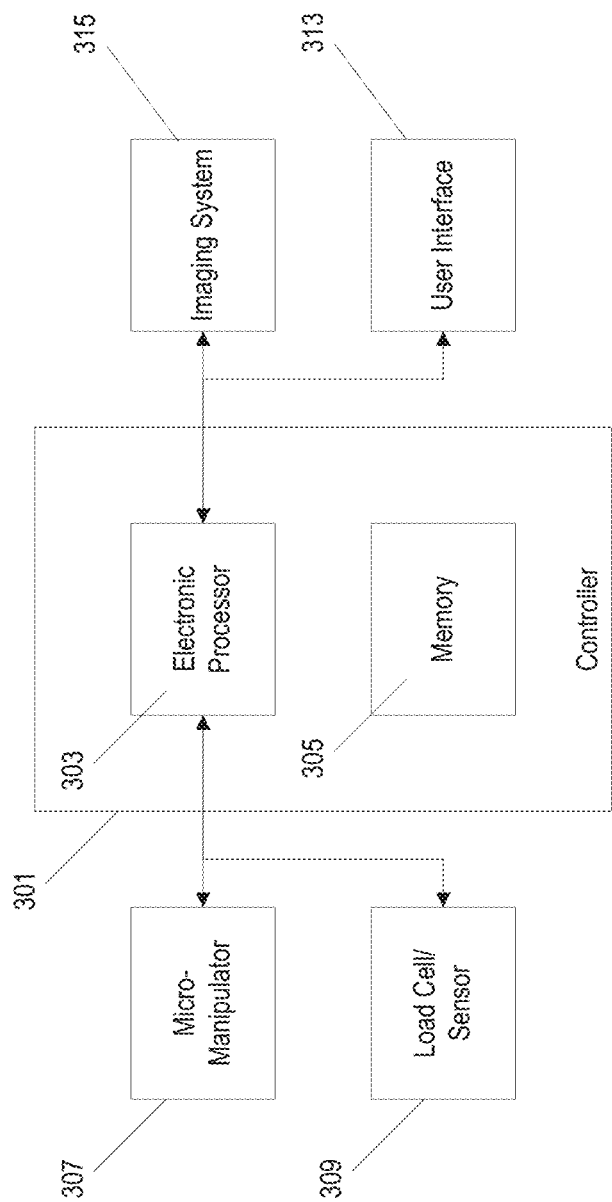
FIG. 3 is a block diagram of a control system for the apparatus of FIG. 1A.

As shown in the block diagram of FIG. 3, the system is operated electronically by a controller 301 including an electronic processor 303 and a non-transitory, computer-readable memory 305. As mentioned above, in some implementations, the controller 301 can be implemented as a computer (e.g., a desktop or laptop personal computer). In other implementations, the controller 301 can be implemented, for example, as a separate device purpose-built for controlling the system of FIG. 1A or as a part of a focused beam imaging system.

The controller 301 provides control signals to operate the micro-manipulator 307 and receives force measurement data from the load cell/sensor 309. In some implementations, the controller 301 also receives image data from an imaging system 315 (e.g., a SEM imaging system). In some implementations, the imaging system 315 is communicatively connected to the controller 301 within the SEM system. The controller 301 may also be configured to interact with a User Interface 313. In some implementations, the user interface 313 may include a display screen and a keyboard/mouse/touchscreen of a computer. The controller 301 may be configured to display data (e.g., image data and force measurement data) to a user through the user interface 313 and to receive commands/instructions for operating the tester device of FIG. 1A through the user interface 313. Although FIG. 3 illustrates a single controller 301, in some implementations, separate controllers are utilized. For example, in some implementations, a first controller may be configured to control the micro manipulator 307 while a second controller is configured to receive/monitor the force measurement data. In this way, the force measurement functionality can be completely decoupled from the operation of the probe.

Figure 4:
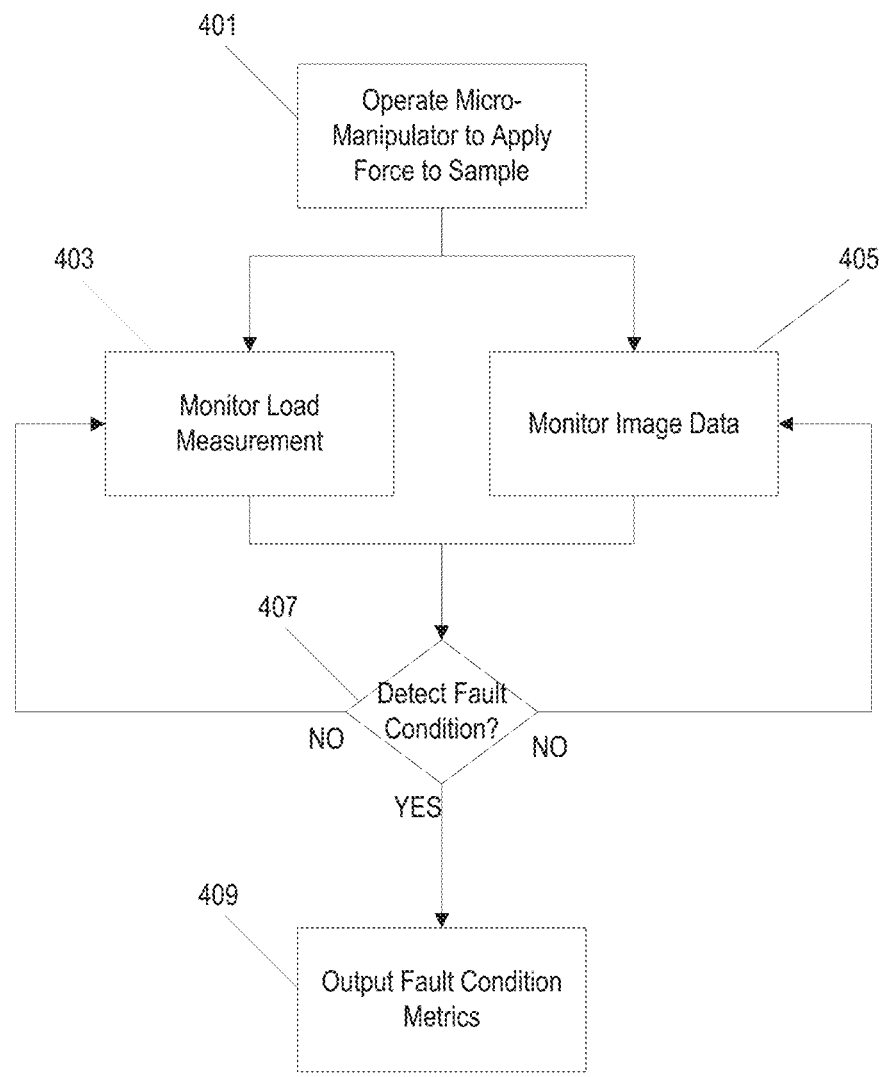
FIG. 4 is a flowchart of a method for performing mechanical testing of a sample device under test using the apparatus of FIG. 1A and implemented by the control system of FIG. 3.

FIG. 4 illustrates one example of a method, implemented by the controller 301 of FIG. 3, for operating the tester system of FIG. 1A. After a sample is coupled to the load cell (e.g., clamped in place by the tilted sample stage 5 of FIG. 1A), the controller 301 operates the micro-manipulator to apply a force to the sample (step 401). In some implementations, the controller 301 is configured to apply a single target force to the sample while, in other implementations, the controller 301 may be configured to apply a variable force to the sample. For example, the controller 301 may be configured to gradually increase the force applied to the sample. As the force is being applied to the sample, the controller 301 receives load measurement data from the load cell/sensor (step 403) and also receives image data from the SEM imaging system (step 405). Based, for example, on the load measurement data and/or the image data, the controller 301 detects when a fault condition occurs (step 407) (e.g., when a wire becomes separated from the microelectronic device under test during a wire pull test). When the fault condition is detected, various metrics are output to the user and/or stored to the memory for future access/use (step 409).

Figure 5:
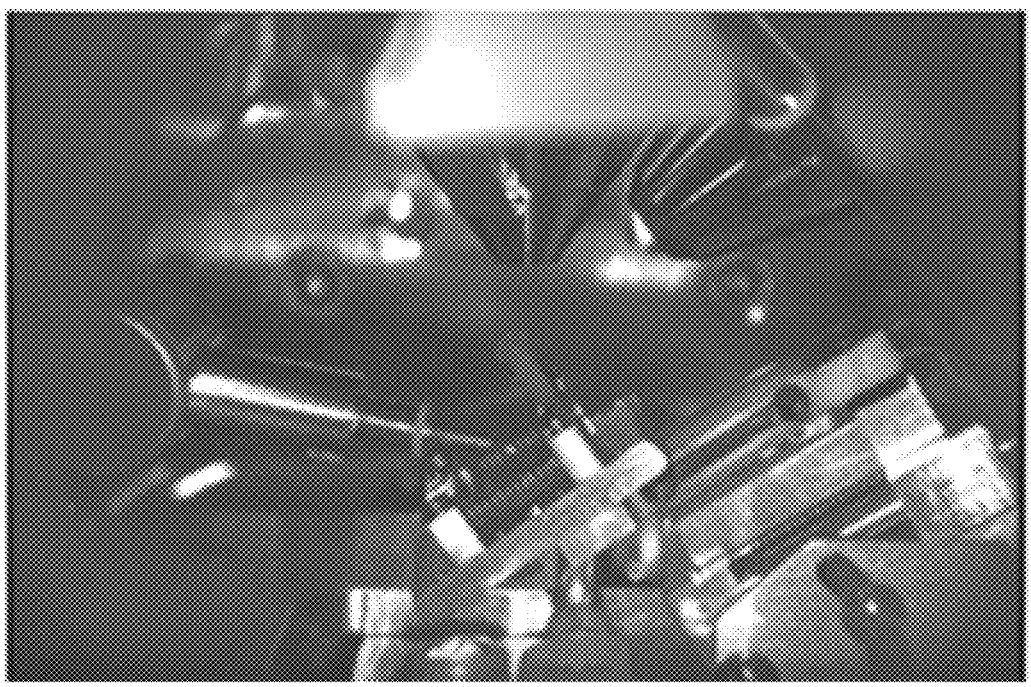
FIG. 5 is an image captured by an imaging system of the apparatus of FIG. 1A configured to perform a bond wire pull-test.

FIG. 5 shows an example of the device of FIG. 1A configured to perform a characteristic bond pull test as imaged by a secondary electron detector. As shown in FIG. 5, the hooked tip of the micro-manipulator probe is coupled to one or more wires bonded to a sample device under test. The system applies a force by retracting the micro-manipulator probe tip causing the micro-manipulator to pull the bonded wires away from the sample device under test.

Figure 6:
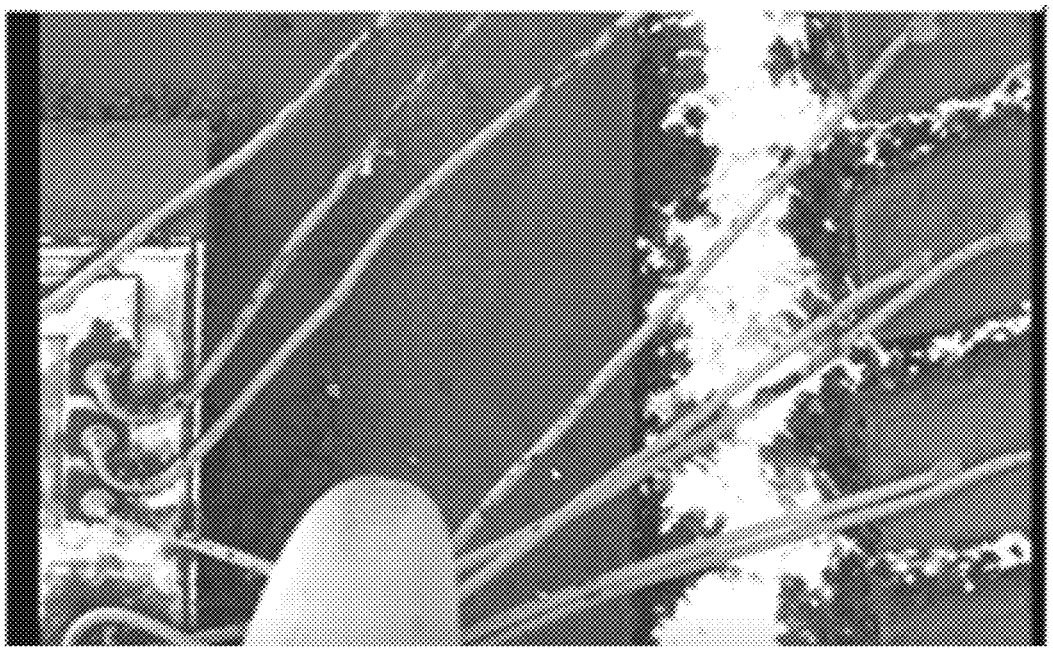
FIG. 6 is an image captured by a scanning electron microscope of the wire bonds of the sample device under test in the bond wire pull-test of FIG. 5.
Figure 7:
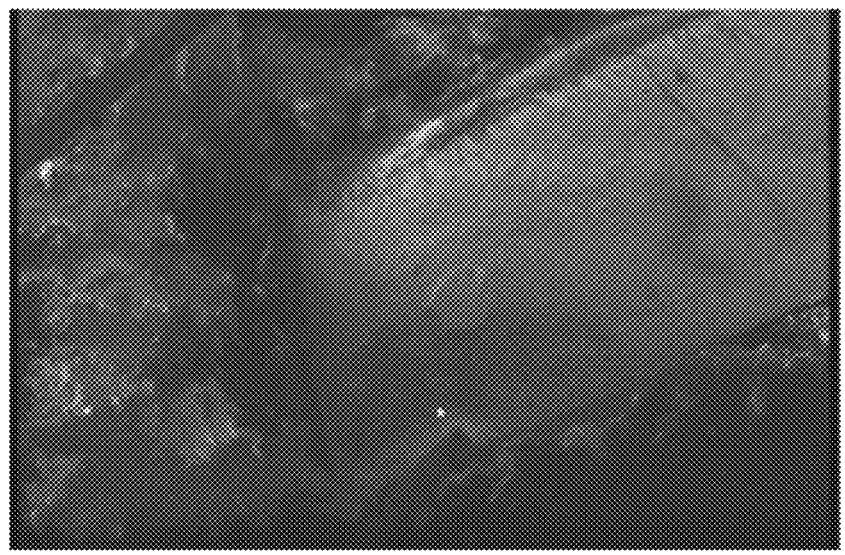
FIG. 7 is an image captured by a scanning electron microscope of a failure point at a wedge bond on a lead pin of the sample device under test in the bond wire pull-test of FIG. 5.

FIG. 6 shows an image of the wire bonds of the sample device under test as captured by the SEM imaging system. In this example, the controller 301 is configured to apply a gradually increasing force until the wire bonds fail and the wires are separated from the sample device under test. FIG. 7 shows an image captured by the SEM of the failure point at the wedge bond on the lead pin of the sample device under test.

Figure 9:
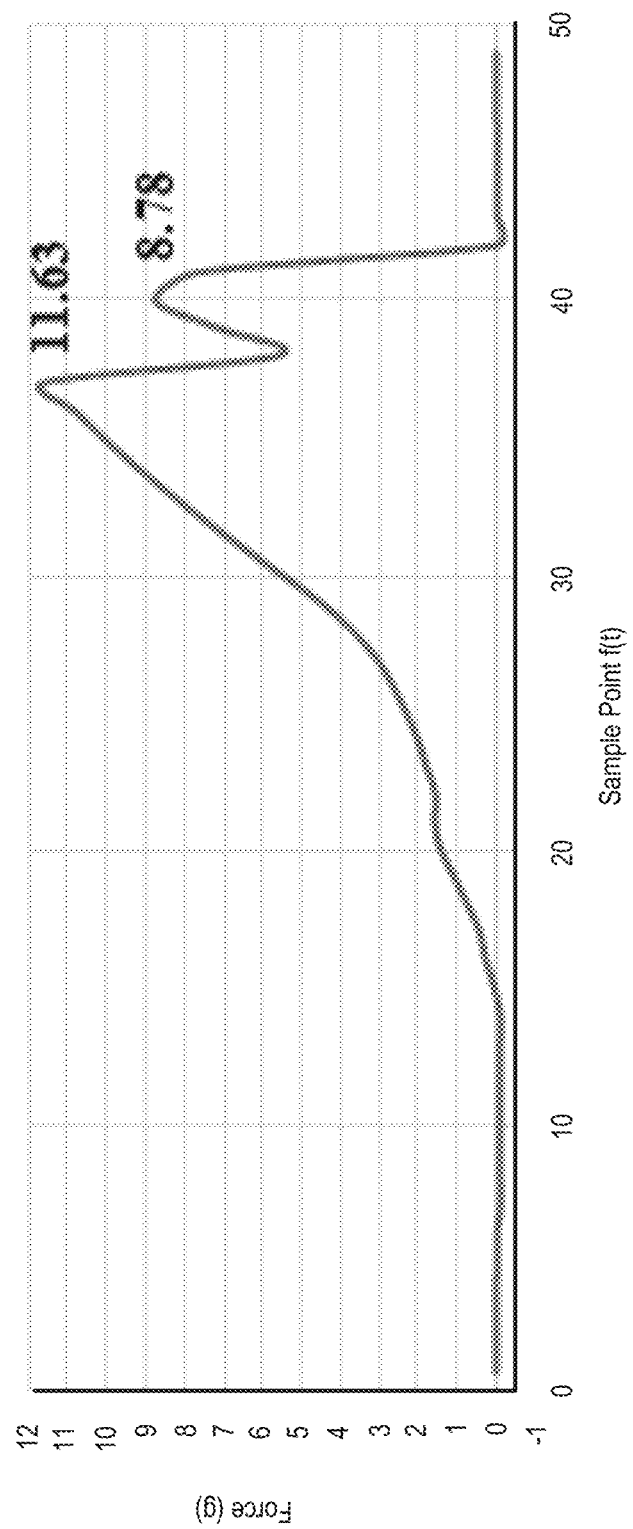
FIG. 9 is a graph of the force measurement from the load cell during the bond wire pull-test of FIG. 5.

As described above, the system is configured to measure and record force data from the load cell while the force is applied to the sample by the micro-manipulator. FIG. 9 shows the force measurement graph from a bond pull test on two wires pulled simultaneously. The force measurement scheme was able to distinguish the force at failure for each of the two wires.

Figure 8:
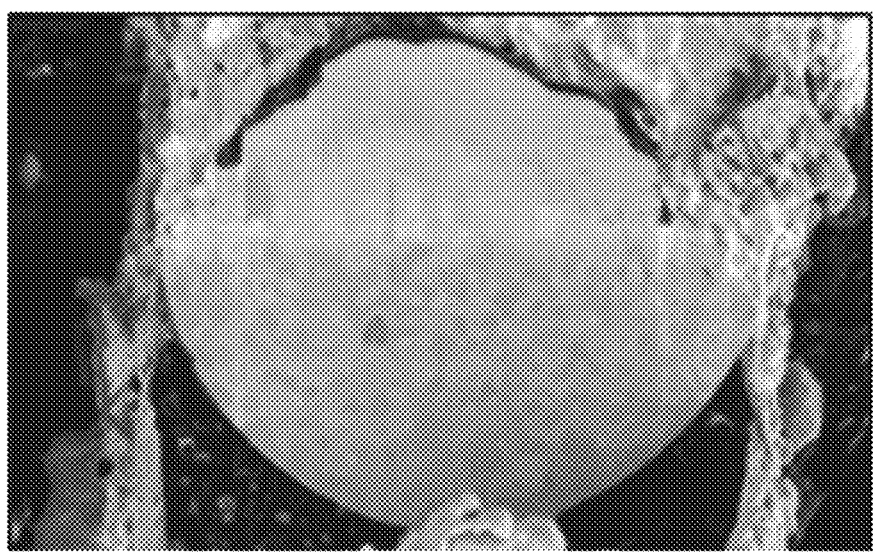
FIG. 8 is an optical visualization of crystallographic information for a bond wire captured by an imaging system during the bond wire pull-testing of FIG. 5.
Figure 10:
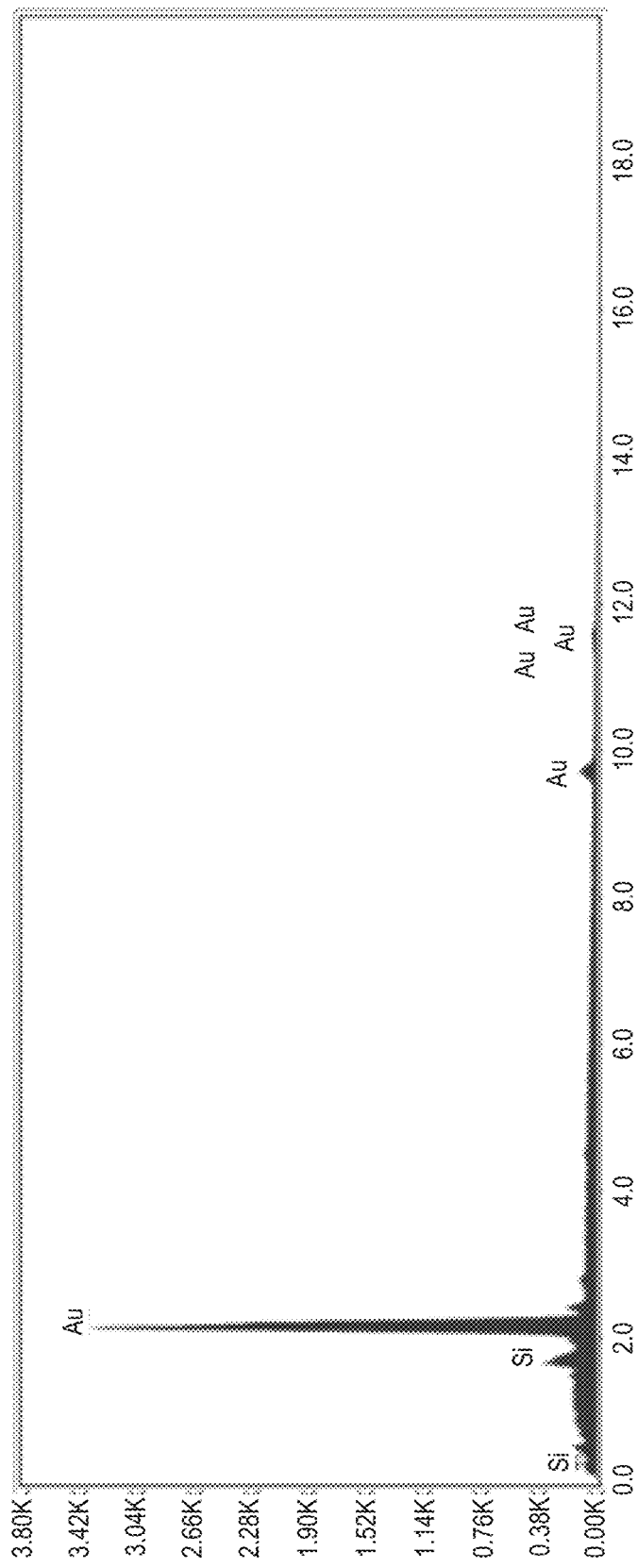
FIG. 10 is a graph of an EDS spectrum for Au bond wire at 16 kV.

In addition to high resolution secondary electron imaging (as illustrated in the examples of FIGS. 6 and 7), compositional information can be extracted through an EDS analysis. FIG. 10 displays the compositional information of a bond wire accessible, in some implementations, during and/or immediately after the in-situ testing described above. Based on this information, it can be determined that the bond wire is fully Au and not Au-coated. Similarly, by using secondary, BSD or EBSD imaging, it is possible to gather information not accessible to optical visualization such as crystallographic information for the bond wire (as illustrated in FIG. 8), or for the damage induced to an Au bond pad during and/or after an Au ball bond shear-/bond wire pull test.

Figure 11A:
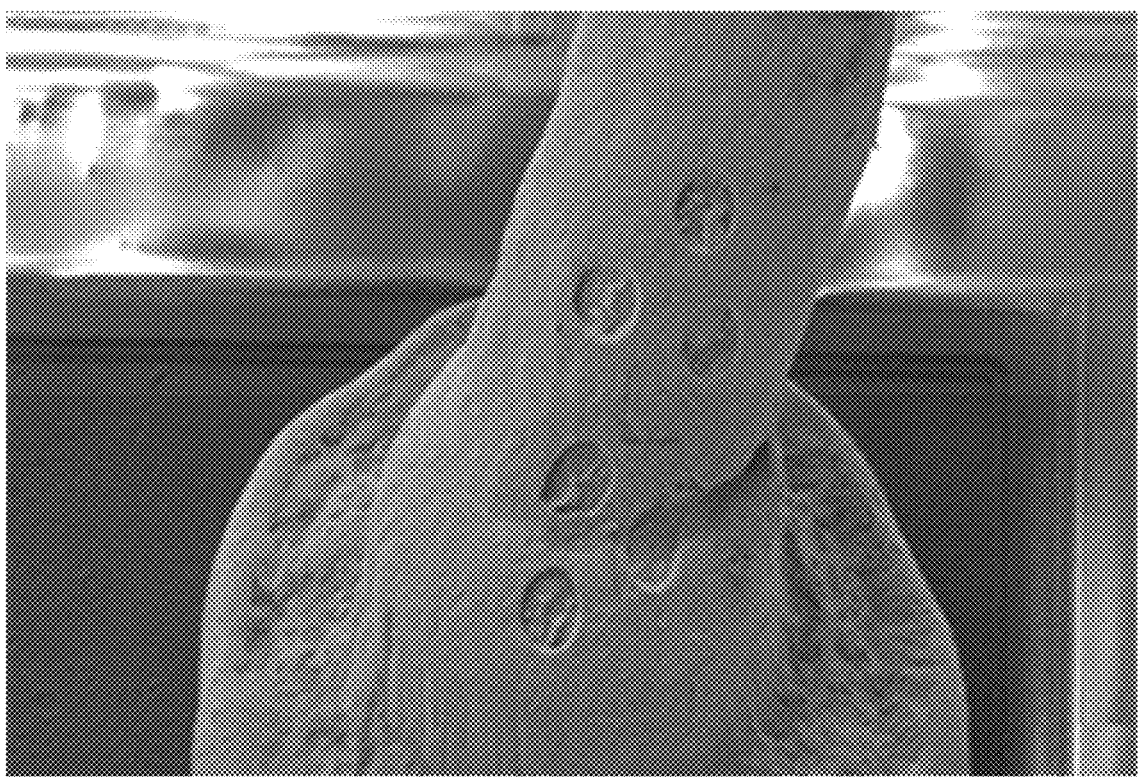
FIGS. 11A and 11B are images captured by a scanning electron microscope during a bond wire pull-test with markings on the bond wire for digital image correlation analysis (DIC).
Figure 11B:
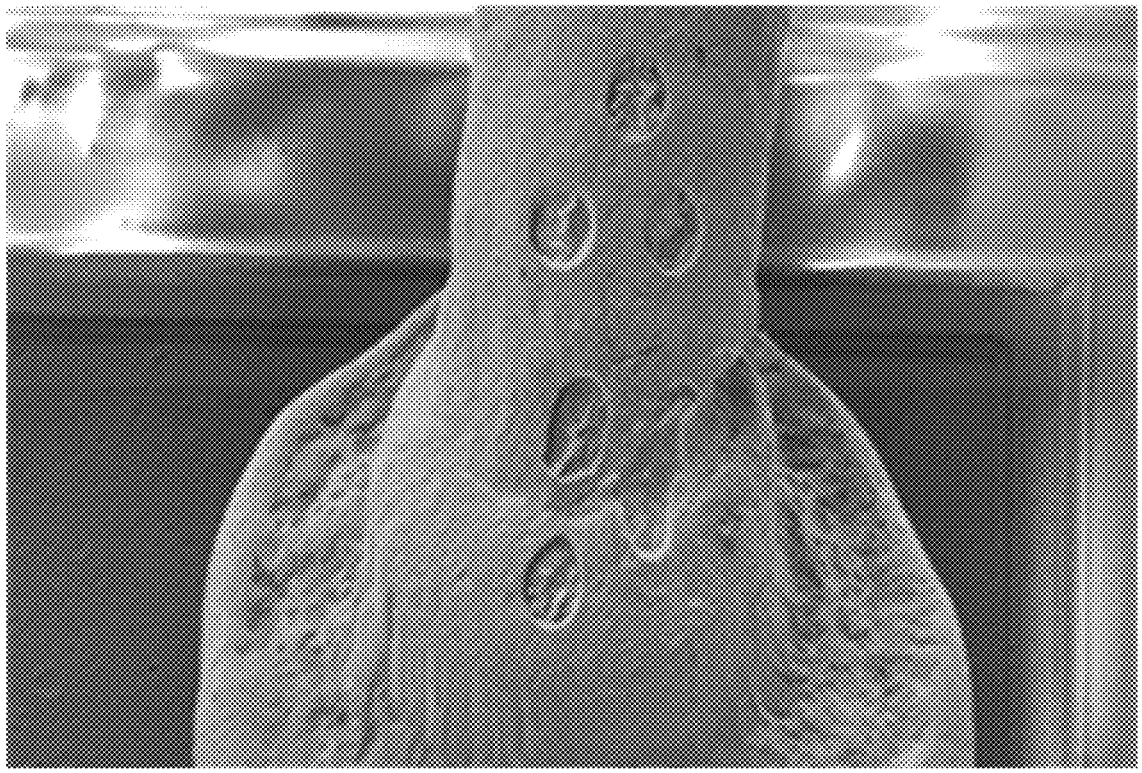

In some implementations, the system may also or alternatively be configured to perform deformation mapping on a tested sample. Digital image correlation (DIC) and digital volume correlation (DVC) analyses can be used to extract strain information on a tested sample. In some implementation, a computer-based processing system can be configured to use the outputs of these analyses to inform computational models of sample behavior under the tested loads. FIGS. 11A and 11B illustrate two images captured by a scanning electron microscope at different times during a wire pull test. The elliptical markings on the bond wires are detectable by a computer system that is configured to subsequently perform digital image correlation.

In some implementations, a modular and compact tester, such as described in the examples above, operates with a commercial nano-manipulator while providing adjustable sample mounting and direct electronic force measurement. Such modular configuration allows the investigator to apply and measure a force exerted on the sample in real-time, while concurrently imaging effects of the mechanical forces on the sample in most existing scanning beam microscopes, such as SEM, HIM/NIM, and SEM/GFIB, and proton beam or optical systems.

By utilizing this apparatus, information collected by the microscope from meso- to micro- and nano-meter scale can be accessed and linked to force measurement data in real time, while performing mechanical tests. Examples of information collected by microscope could include but are not limited to: crystallographic information, elemental composition information, surface and sub-surface electrical potential information, electrical current flow information, polarization information, charge and charge distribution information, magnetic domain information, and high-resolution topographical information.

Furthermore, although the examples described above focus primarily on bond wire pull testing, other applications are also possible including, for example, scratch testing of processed coatings (applicable in aerospace and biomedical industries), surface tribology investigations of novel nano-technology-enabled materials, and testing of micro- and nano-sensors (such as MEMS/NEMS accelerometers) for self-driving cars and space exploration robots.

Figure 12:
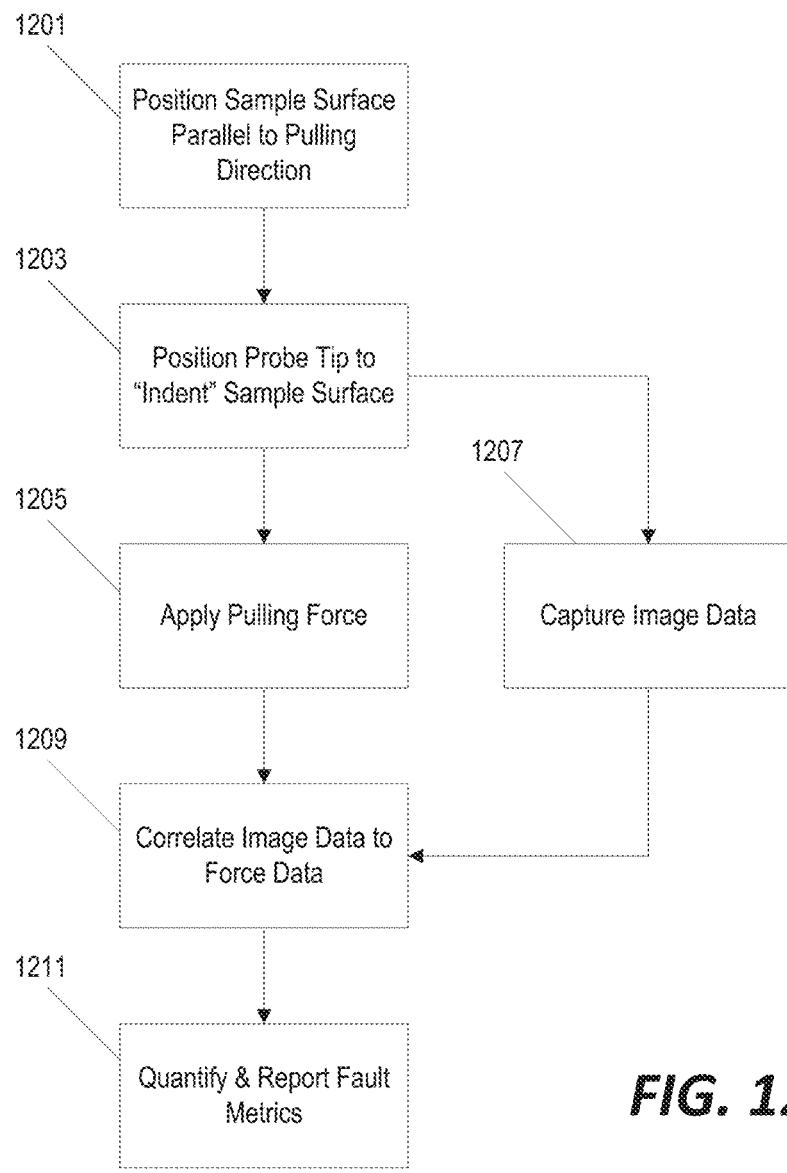
FIG. 12 is a flowchart of a method for performing an adhesion/cohesion testing of a sample using the apparatus of FIG. 1A and implemented by the control system of FIG. 3.

FIG. 12 illustrates a method for performing a "scratch" testing to evaluate adhesion and cohesion of a surface coating on a sample. First, the sample is positioned in the sample stage with the tiltable clamp adjusted such that the surface of the sample is substantially parallel to a pulling direction of the micromanipulator (step 1201). The probe tip is positioned to form an indentation in the surface coating of the sample (step 1203). In some implementations, this can be performed manually by lifting the end of the probe with a finger and releasing it towards the sample surface. In other implementations, the micromanipulator may be further configured to apply a force in the z-direction to controllably press the probe tip into the surface of the sample.

Once the probe tip has formed an indentation in the sample surface, a pulling force is applied by the micromanipulator (step 1205). Due to the orientation of the sample relative to the micromanipulator, this pulling force causes the probe tip to "scratch" the surface of the sample. Image data is captured by the scanning electron microscope (SEM) while the pulling force is applied (step 1207) and the captured image data is correlated to the measured force data by a computer-based processing system (step 1209). The correlated data is then analyzed to quantity and report fault metrics for the surface coating (step 1211).

Figure 13:
FIG. 13 is an image captured by a scanning electron microscope of a surface of the sample after performing the scratch testing of FIG. 12 while moving the probe in a linear direction.
Figure 14:
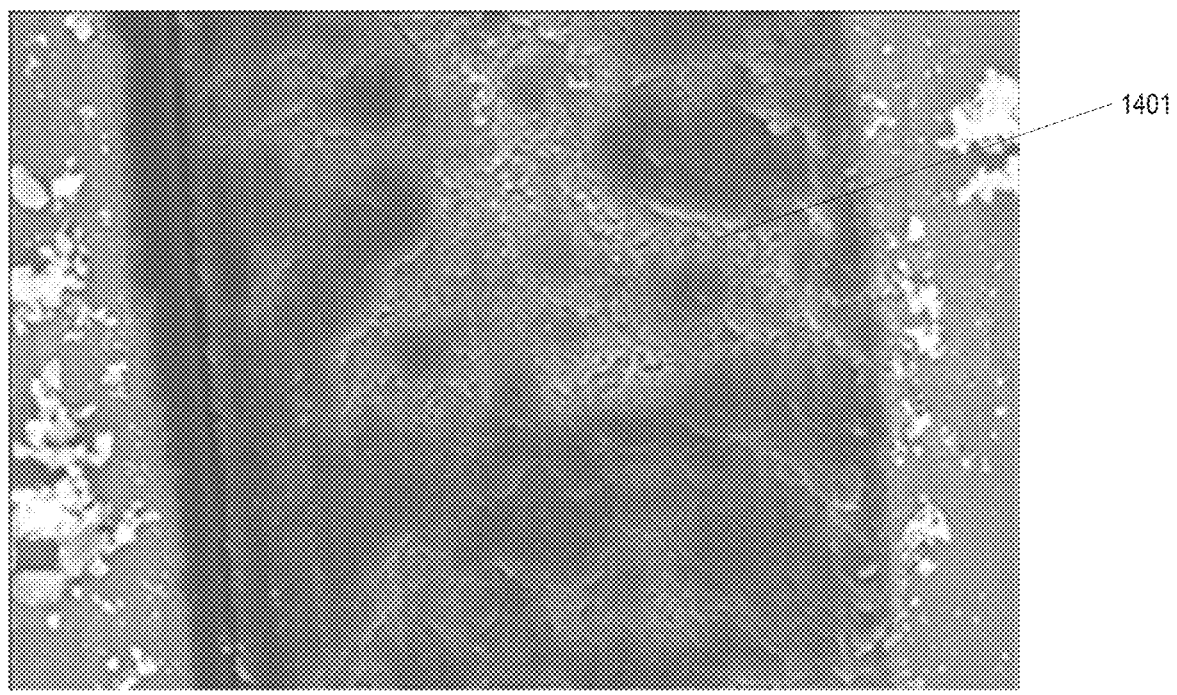
FIG. 14 is an image captured by a scanning electron microscope of a surface of the sample after performing the scratch testing of FIG. 12 while moving the probe in a circular direction.

In some implementations, the system may be configured to apply the pulling force during the scratch testing in a single linear direction as illustrated by the linear scratch marks 1301 in FIG. 13. FIG. 14 is a zoomed view of the left-most scratch in FIG. 13. The linear scratch mark 1401 in FIG. 14 is made with a different sized probe from the linear scratch mark 1301 in FIG. 13. In some implementations, the probe tips can be selectively switched out to vary testing capabilities without impacting the system's force measurement scheme. Although the examples of FIGS. 13 and 14 both show linear scratching in the same direction, in some implementations, the system may be configured to perform the scratching movement in different patterns and in different directions relative to the surface of the sample.

End-users of systems and methods such as those described herein could include, for example, semiconductor device manufacturers, independent commercial quality testing and failure analysis labs working with microelectronics and/or specialty coatings industry, and academic labs involved in creation or characterization novel materials when they perform routine or special quality assurance tests to track anomalies or long-term trends.

In some implementations, because of its modular design approach, the proposed in-situ tester is compatible and could be readily used with the most of existing microscopes and FIB/SEM/HIM instruments, many of which are already equipped by in-situ manipulators, thus providing a low-cost tool for mechanical testing which can be used for research and educational purposes. Any research project which requires the investigation of mechanical performance on the meso- or nano-scales could be approached with this tool in-situ of a scanning beam microscope.

As described above, in at least some implementations, the tester device is configured such that forces applied to a sample are measured directly on the sample-side of the apparatus during wire pull testing. Having the force measurement occur on the sample end would mean that no change is necessary for components related to the probe-side of the apparatus when changing between different types of testing (e.g., wire pull tests vs. scratch testing) or if a different load cell is needed. The need for only one probe arm to perform multiple different types of testing decreases the overall cost. In many situations, the only expense required to adapt the system for different testing conditions would be the cost of a different load cell. For reference, load cells on this scale typically cost only a few to tens of dollars. The load cell used in the examples described herein cost approximately $7 USD.

Similarly, in some implementations, the proposed apparatus can support the integration of many different types of commercial or experimental probing robot arms which, in turn, makes the apparatus more accessible to a wider audience. The proposed apparatus can also be configured to support multiple probing robot arms at once. This can allow for highly customized testing (e.g., multi-point mechanical loadings, simultaneous mechanical and electrical probing, etc.) with only the added cost of a probing robot arm.

As also described above, in at least some implementations, the tester device is configured to include a tiltable sample/load cell stage placed relative to the mounting of the robotic probe arm, which itself has a range of mounting positions. Accordingly, the relative position and angle of both the sample and the robotic arm can be adjusted for a particular test. The tiltable stage and robot arm mounting allows for great flexibility in terms of loading direction. There is a continuous range of pulling directions that can be probed just by setting the tiltable stage to a fixed position.

The nearly perfect adherence to Moore's Law presents an evolving challenge to the world of electronic quality and security assurance. New chip architectures and shrinking component sizes bode well for performance and so the technology will continue to trend towards increased complexity and miniaturization. As a result, more sophisticated testing and investigative techniques need to be employed to study defects on smaller length scales. The optical techniques commonly used in bond wire mechanical testing possess the ability to capture only surface-level information and are limited to a resolution on the order of hundreds of nanometers. A modality like scanning electron microscopy (SEM) boasts a much wider performance envelope. They can image on a nanometer-scale and have multiple imaging modes that provide unique information at some distance below the surface. Secondary electron imaging, back-scattered electron imaging (BSD), electron back-scattered diffraction (EBSD), energy dispersive spectroscopy (EDS), and Auger electron spectroscopy (AES) are just a few different imaging modes that can produce crystallographic, topographical, and qualitative and quantitative elemental data. As discussed above, this rich source of information can be utilized for both failure analysis and characterization of bond wires. The information retrieved also presents an opportunity to refine finite element models of bond wires for computer simulation.

Furthermore, the proliferation of counterfeit microelectronics has steadily increased over the last 15 years with overall costs to manufacturers climbing well into the billions. Because of their higher propensity to prematurely fail and the possibility for malicious misuse, there is a concerted effort to understand, catalogue, and prevent the spread of counterfeit microelectronics. Certain bond wire counterfeiting techniques such as: Au-coating Cu-bond wires for Au-marketed bond wires or chip remarking and recycling, are difficult and sometimes impossible to catch through reflective light microscopy. Further probing is required to definitively determine the cause of poor performance in a standard mechanical QA test. By performing these tests in-situ of an SEM, compositional, crystallographic, and nanometer-level topographical variations can be examined immediately, helping to diagnose and better understand counterfeiting practices.

In addition to other possible benefits, tests performed using the systems and methods described above can be beneficial for combating counterfeit microelectronic and to reconcile the exponential miniaturization of microelectronic components. The systems and methods described above specifically provide a bond wire pull-testing apparatus for testing within an SEM where both the force at failure and failure mode are recorded. Additional analyses are also possible including, for example, BSD, EBSD, AES, and other imaging modes, all providing a more comprehensive and robust understanding of the results of mechanical testing such as, for example, a wire bond pull-test.

Thus, the invention provides, among other things, a system and method for directly measuring forces applied to a sample device under test while simultaneously capturing electronic microscope image data of the same device under test. Various features and advantages of the invention are demonstrated in the accompanying drawings.

What is claimed is:

1. A method for direct-measurement of mechanical properties of a sample during electronic imaging, the method comprising:
    positioning a load cell into physical contact with a sample under test, where the load cell is configured to measure a magnitude of force applied to the sample under test;
    capturing electronic image data of the sample under test; and
    operating an actuator to apply a force to the sample under test while capturing the electronic image data.

2. The method of claim 1, further comprising correlating force data received from the load cell with the electronic image data.

3. The method of claim 1, further comprising coupling the sample under test to a device frame, wherein the actuator is coupled to the device frame and configured to controllably move a probe relative to the sample under test.

4. The method of claim 1, wherein the sample under test includes a microelectronic component with at least one wire bonded to a microelectronic device, the method further comprising:
    coupling a probe of the actuator to the at least one wire bonded to the microelectronic device, wherein operating the actuator to apply a force to the sample under test includes controllably moving the probe of a micromanipulator to pull the at least one wire bonded to the microelectronic device; and
    detecting a force measured by the load cell when a wire bond of the microelectronic device fails and the at least one wire separates from the microelectronic device.

5. The method of claim 1, further comprising:
    selectively coupling the actuator to a base frame at a target position and orientation relative to the sample under test, wherein the base frame is configured for selectively coupling of the actuator at a plurality of different positions and orientations relative to the sample under test.

6. The method of claim 5, wherein the base frame includes a plurality of milled slots, and wherein selectively coupling the actuator to the base frame at the target position and orientation includes
    positioning the actuator in a slot of the plurality of milled slots;
    sliding the actuator in the slot towards the target position relative to the sample; and
    securing the actuator to the base frame at the target position in the slot.

7. The method of claim 1, wherein positioning the load cell into physical contact with the sample under test includes coupling the sample to a tiltable sample-load cell stage, wherein the tiltable sample-load cell stage and the actuator are coupled to a device base frame, the method further comprising adjusting an angle of the tiltable sample-load cell stage to position the sample under test at a target position and orientation relative to the actuator.

8. The method of claim 1, wherein the sample under test includes a surface with an applied coating, the method further comprising:
    moving a distal tip of a probe of the actuator to form an indentation in the coated surface of the sample under test, wherein operating a micromanipulator to apply a force to the sample under test includes controllably moving the probe of the actuator to pull the distal tip of the probe from the indentation across the coated surface to form a scratch in the coated surface; and
    detecting a force measured by the load cell as the scratch is formed in the coated surface.

9. A system for direct-measurement of mechanical properties of a sample during electronic imaging, the system comprising:
    a load cell selectively positionable into physical contact with a sample under test, where the load cell is configured to measure a magnitude of force applied to the sample under test;
    an actuator configured to apply a force to the sample under test while electronic image data of the sample under test is captured; and
    an electronic controller configured to
    receive the electronic image data from an imaging system, wherein the electronic image data includes the sample under test and is captured by the imaging system while the force is applied to the sample under test by the actuator, and correlate data indicative of the magnitude of force applied to the sample under test with the electronic image data.

10. The system of claim 9, further comprising a device frame, wherein the device frame is selectively couplable to the sample under test,
wherein the actuator is coupled to the device frame and is configured to controllably move an adjustable probe of the actuator relative to the sample under test.

11. The system of claim 9, wherein the sample under test includes a microelectronic component with at least one wire bonded to a microelectronic device,
wherein the actuator includes a probe,
wherein a distal end of the probe is selectively couplable to the at least one wire bonded to the microelectronic device,
wherein the actuator is configured to apply the force to the sample under test by controllably moving the probe of the actuator to pull the at least one wire bonded to the microelectronic device, and
wherein the electronic controller is further configured to detect a force measured by the load cell when a wire bond of the microelectronic device fails and the at least one wire separates from the microelectronic device.

12. The system of claim 11, wherein the electronic controller is further configured to detect when the wire bond of the microelectronic device fails by analyzing the electronic image data.

13. The system of claim 9, further comprising a base frame configured for selectively coupling of the actuator to the base frame at a plurality of different positions and orientations relative to the sample under test.

14. The system of claim 13, wherein the base frame includes a plurality of milled slots, and wherein the actuator is selectively coupled to the base frame at a plurality of different positions and orientations by
positioning a coupling of the actuator in a slot of the plurality of milled slots;
sliding the actuator in the slot towards a target position relative to the sample under test; and
securing the actuator to the base frame at the target position in the slot.

15. The system of claim 9, further comprising a tiltable sample-load cell stage, wherein the tiltable sample-load cell stage and the actuator are coupled to a device base frame, wherein the tiltable sample-load cell stage is configured to tiltably adjust an angular position of the sample under test relative to the actuator.

16. The system of claim 9, wherein the sample under test includes a surface with an applied coating, wherein a distal tip of a probe of the actuator is configured to form an indentation in the coated surface of the sample under test, wherein the actuator is configured to apply the force to the sample under test by controllably moving the probe of the actuator to pull the distal tip of the probe from the indentation across the coated surface to form a scratch in the coated surface, and wherein the electronic controller is configured to detect a force measured by the load cell as the scratch is formed in the coated surface.

17. The system of claim 9, further comprising a plurality of load cells including the load cell, wherein each load cell of the plurality of load cells is configured to sense force in a different spatial axis.

18. The system of claim 17, wherein the plurality of load cells includes three load cells, and wherein the electronic controller is configured to receive an output signal from each load cell of the plurality of load cells and to calculate a total force on the sample based on the output signals.

19. The system of claim 9, wherein the load cell is configured to sense force in three dimensions.

20. A method for direct-measurement of mechanical properties of a sample during electronic imaging, the method comprising:
coupling a load cell to a sample under test, where the load cell is configured to measure a magnitude of force applied to the sample under test;
capturing electronic image data of the sample under test;
operating an actuator to apply a force to the sample under test while capturing the electronic image data; and
correlating force data received from the load cell with the electronic image data.

* * * * *

(12) EX PARTE REEXAMINATION CERTIFICATE (12809th)
United States Patent
Favata et al.

(10) Number: US 11,557,456 C1
(45) Certificate Issued: Dec. 20, 2024

(54) REAL-TIME DIRECT MEASUREMENT OF MECHANICAL PROPERTIES IN-SITU OF SCANNING BEAM MICROSCOPE

(71) Applicant: University of Connecticut, Farmington, CT (US)

(72) Inventors: Joseph Favata, Farmington, CT (US); Slna Shahbazmohamadi, Farmington, CT (US); Valery Ray, Farmington, CT (US); Ali Hadjikhani, Farmington, CT (US)

(73) Assignee: UNIVERSITY OF CONNECTICUT, Farmington, CT (US)

Reexamination Request:
No. 90/019,455, Mar. 22, 2024

Reexamination Certificate for:
Patent No.:  11,557,456
Issued:      Jan. 17, 2023
Appl. No.:   16/569,384
Filed:       Sep. 12, 2019

Related U.S. Application Data

(60) Provisional application No. 62/731,360, filed on Sep. 14, 2018.

(51) Int. Cl.
  *H01J 37/256* (2006.01)
  *G01N 3/06* (2006.01)
  *G01N 3/08* (2006.01)
  *H01J 37/244* (2006.01)

(52) U.S. Cl.
  CPC ............ *H01J 37/256* (2013.01); *G01N 3/068* (2013.01); *G01N 3/08* (2013.01); *H01J 37/244* (2013.01)

(58) Field of Classification Search
  None
  See application file for complete search history.

(56) References Cited

To view the complete listing of prior art documents cited during the proceeding for Reexamination Control Number 90/019,455, please refer to the USPTO's Patent Electronic System.

*Primary Examiner* — Kenneth Whittington

(57) ABSTRACT

System and methods are described for directly measuring mechanical properties of a sample while concurrently imaging the sample using a scanning beam microscope (e.g., a scanning electron microscope (SEM)).

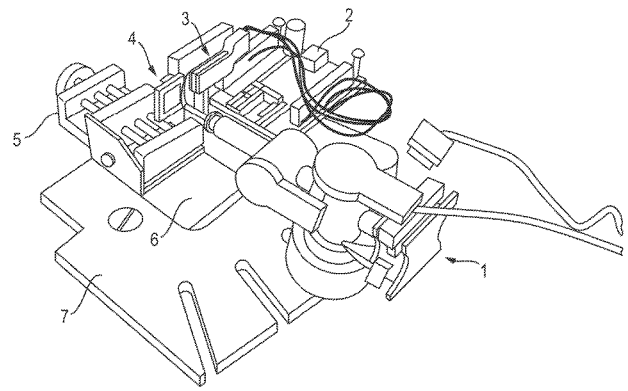
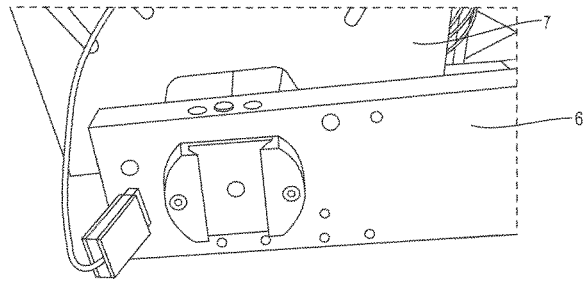

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 4, 11, and 20 are cancelled.

Claims 1, 6, 9, 12, 14, and 18 are determined to be patentable as amended.

Claims 2, 3, 5, 7, 8, 10, 13, 15-17, and 19, dependent on an amended claim, are determined to be patentable.

1. A method for direct-measurement of mechanical properties of a sample during electronic imaging, *wherein the sample under test includes a microelectronic component with at least one wire bonded to a microelectronic device,* the method comprising:
    positioning a load cell into physical contact with a sample under test, where the load cell is configured to measure a magnitude of force applied to the sample under test;
    capturing electronic image data of the sample under test; [and]
    operating an actuator to apply a force to the sample under test while capturing the electronic image data*;*
    *coupling a probe of the actuator to the at least one wire bonded to the microelectronic device, wherein operating the actuator to apply a force to the sample under test includes controllably moving the probe of a micromanipulator to pull the at least one wire bonded to the microelectronic device; and*
    *detecting a force measured by the load cell when a wire bond of the microelectronic device fails and the at least one wire separates from the microelectronic device.*

6. [The method of claim 5,] *A method for direct-measurement of mechanical properties of a sample during electronic imaging, the method comprising:*
    *positioning a load cell into physical contact with a sample under test, where the load cell is configured to measure a magnitude of force applied to the sample under test;*
    *capturing electronic image data of the sample under test;*
    *operating an actuator to apply a force to the sample under test while capturing the electronic image data;*
    *selectively coupling the actuator to a base frame at a target position and orientation relative to the sample under test, wherein the base frame is configured for selectively coupling of the actuator at a plurality of different positions and orientations relative to the sample under test;*
    wherein the base frame includes a plurality of milled slots, and wherein selectively coupling the actuator to the base frame at the target position and orientation includes
    positioning the actuator in a slot of the plurality of milled slots;
    sliding the actuator in the slot towards the target position relative to the sample; and
    securing the actuator to the base frame at the target position in the slot.

9. A system for direct-measurement of mechanical properties of a sample during electronic imaging, the system comprising:
    a load cell selectively positionable into physical contact with a sample under test, where the load cell is configured to measure a magnitude of force applied to the sample under test;
    an actuator configured to apply a force to the sample under test while electronic image data of the sample under test is captured; and
    an electronic controller configured to
    receive the electronic image data from an imaging system, wherein the electronic image data includes the sample under test and is captured by the imaging system while the force is applied to the sample under test by the actuator, and
    correlate data indicative of the magnitude of force applied to the sample under test with the electronic image data,
    *wherein the sample under test includes a microelectronic component with at least one wire bonded to a microelectronic device,*
    *wherein the actuator includes a probe,*
    *wherein a distal end of the probe is selectively couplable to the at least one wire bonded to the microelectronic device,*
    *wherein the actuator is configured to apply the force to the sample under test by controllably moving the probe of the actuator to pull the at least one wire bonded to the microelectronic device, and*
    *wherein the electronic controller is further configured to detect a force measured by the load cell when a wire bond of the microelectronic device fails and the at least one wire separates from the microelectronic device.*

12. [The system of claim 11.] *A system for direct-measurement of mechanical properties of a sample during electronic imaging, the system comprising:*
    *a load cell selectively positionable into physical contact with a sample under test, where the load cell is configured to measure a magnitude of force applied to the sample under test;*
    *an actuator configured to apply a force to the sample under test while electronic image data of the sample under test is captured; and*
    *an electronic controller configured to*
    *receive the electronic image data from an imaging system, wherein the electronic image data includes the sample under test and is captured by the imaging system while the force is applied to the sample under test by the actuator,*
    *correlate data indicative of the magnitude of force applied to the sample under test with the electronic image data,*
    *wherein the sample under test includes a microelectronic component with at least one wire bonded to a microelectronic device,*
    *wherein the actuator includes a probe,*
    *wherein a distal end of the probe is selectively couplable to the at least one wire bonded to the microelectronic device,*
    *wherein the actuator is configured to apply the force to the sample under test by controllably moving the probe of the actuator to pull the at least one wire bonded to the microelectronic device,*
    *wherein the electronic controller is further configured to detect a force measured by the load cell when a wire bond of the microelectronic device fails and the at least one wire separates from the microelectronic device, and* wherein the electronic controller is further configured to detect when the wire bond of the microelectronic device fails by analyzing the electronic image data.

14. [The system of claim 13,] *A system for direct-measurement of mechanical properties of a sample during electronic imaging, the system comprising:*

*a load cell selectively positionable into physical contact with a sample under test, where the load cell is configured to measure a magnitude of force applied to the sample under test;*

*an actuator configured to apply a force to the sample under test while electronic image data of the sample under test is captured; and*

*an electronic controller configured to*

*receive the electronic image data from an imaging system, wherein the electronic image data includes the sample under test and is captured by the imaging system while the force is applied to the sample under test by the actuator, and*

*correlate data indicative of the magnitude of force applied to the sample under test with the electronic image data;*

*a base frame configured for selectively coupling of the actuator to the base frame at a plurality of different positions and orientations relative to the sample under test;* wherein the base frame includes a plurality of milled slots, and wherein the actuator is selectively coupled to the base frame at a plurality of different positions and orientations by positioning a coupling of the actuator in a slot of the plurality of milled slots;

sliding the actuator in the slot towards a target position relative to the sample under test; and securing the actuator to the base frame at the target position in the slot.

18. [The system of claim 17,] *A system for direct-measurement of mechanical properties of a sample during electronic imaging, the system comprising:*

*a load cell selectively positionable into physical contact with a sample under test, where the load cell is configured to measure a magnitude of force applied to the sample under test;*

*an actuator configured to apply a force to the sample under test while electronic image data of the sample under test is captured;*

*an electronic controller configured to*

*receive the electronic image data from an imaging system, wherein the electronic image data includes the sample under test and is captured by the imaging system while the force is applied to the sample under test by the actuator, and*

*correlate data indicative of the magnitude of force applied to the sample under test with the electronic image data;*

*a plurality of load cells including the load cell, wherein each load cell of the plurality of load cells is configured to sense force in a different spatial axis; and* wherein the plurality of load cells includes three load cells, and wherein the electronic controller is configured to receive an output signal from each load cell of the plurality of load cells and to calculate a total force on the sample based on the output signals.

\* \* \* \* \*